(12) United States Patent
Wu

(10) Patent No.: US 9,646,922 B2
(45) Date of Patent: May 9, 2017

(54) METHODS AND APPARATUS FOR THINNER PACKAGE ON PACKAGE STRUCTURES

(71) Applicant: Taiwan Semiconductor Manufacturing Company, Ltd., Hsin-Chu (TW)

(72) Inventor: Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/703,695

(22) Filed: May 4, 2015

(65) Prior Publication Data

US 2015/0235934 A1 Aug. 20, 2015

Related U.S. Application Data

(62) Division of application No. 13/350,499, filed on Jan. 13, 2012, now abandoned.

(51) Int. Cl.
*H01L 23/00* (2006.01)
*H01L 23/498* (2006.01)
*H01L 25/065* (2006.01)

(52) U.S. Cl.
CPC .. *H01L 23/49811* (2013.01); *H01L 23/49805* (2013.01); *H01L 23/49822* (2013.01);
(Continued)

(58) Field of Classification Search
CPC . H01L 2224/32145; H01L 2924/15153; H01L 25/0657; H01L 2924/1517; H01L 23/49822

See application file for complete search history.

(56) References Cited

U.S. PATENT DOCUMENTS 6,583,503 B2 6/2003 Akram et al.
7,049,692 B2 5/2006 Nishimura et al.
(Continued)

FOREIGN PATENT DOCUMENTS

CN 101359659 2/2009
TW M406260 6/2011
(Continued)

*Primary Examiner* — Ngan Ngo
(74) *Attorney, Agent, or Firm* — Slater Matsil, LLP

(57) ABSTRACT

Methods and apparatus for thinner package on package ("PoP") structures. A structure includes a first integrated circuit package including at least one integrated circuit device mounted on a first substrate and a plurality of package on package connectors extending from a bottom surface; and a second integrated circuit package including at least another integrated circuit device mounted on a second substrate and a plurality of lands on an upper surface coupled to the plurality of package on package connectors, and a plurality of external connectors extending from a bottom surface; wherein at least the second substrate is formed of a plurality of layers of laminated dielectric and conductors. In another embodiment a cavity is formed on the bottom surface of the first substrate and a portion of the another integrated circuit extends partially into the cavity. Methods for making the PoP structures are disclosed.

20 Claims, 13 Drawing Sheets

(52) U.S. Cl.
CPC .. *H01L 23/49866* (2013.01); *H01L 23/49894* (2013.01); *H01L 25/0657* (2013.01); *H01L 2224/32145* (2013.01); *H01L 2924/1517* (2013.01); *H01L 2924/15153* (2013.01)

(56) References Cited

U.S. PATENT DOCUMENTS

| | | | |
|---|---|---|---|
| 7,064,444 | B2 | 6/2006 | Lee et al. |
| 7,217,994 | B2 | 5/2007 | Zhu et al. |
| 7,566,966 | B2 | 7/2009 | Chow et al. |
| 7,843,059 | B2 | 11/2010 | Gomyo et al. |
| 8,115,293 | B2 | 2/2012 | Moon et al. |
| 8,208,268 | B2 | 6/2012 | Kajiki et al. |
| 8,508,048 | B2 | 8/2013 | Honjo |
| 8,569,887 | B2 | 10/2013 | Hwang et al. |
| 8,685,792 | B2 * | 4/2014 | Chow ............... H01L 25/03 257/678 |
| 8,736,065 | B2 | 5/2014 | Gonzalez et al. |
| 2004/0150102 | A1 * | 8/2004 | Lee .................. H01L 25/105 257/723 |
| 2005/0077620 | A1 * | 4/2005 | Hsin ................ H01L 23/5388 257/723 |
| 2007/0013058 | A1 * | 1/2007 | Choi ................ H01L 23/481 257/723 |
| 2008/0042265 | A1 | 2/2008 | Merilo et al. |
| 2008/0142961 | A1 * | 6/2008 | Jones .............. H01L 25/165 257/724 |
| 2008/0164605 | A1 | 7/2008 | Wu |
| 2009/0032927 | A1 | 2/2009 | Kim et al. |
| 2009/0065929 | A1 | 3/2009 | Hiranuma et al. |
| 2009/0152693 | A1 | 6/2009 | Sato |
| 2009/0154128 | A1 | 6/2009 | Tamadate |
| 2010/0123235 | A1 | 5/2010 | Kim et al. |
| 2011/0100692 | A1 | 5/2011 | Topacio et al. |
| 2011/0115098 | A1 | 5/2011 | Song et al. |
| 2011/0140263 | A1 | 6/2011 | Camacho et al. |
| 2011/0147933 | A1 | 6/2011 | Wu et al. |
| 2012/0075807 | A1 | 3/2012 | Refai-Ahmed et al. |
| 2012/0161316 | A1 | 6/2012 | Gonzalez et al. |
| 2012/0161331 | A1 | 6/2012 | Gonzalez et al. |

FOREIGN PATENT DOCUMENTS

| | | |
|---|---|---|
| TW | 201123380 | 7/2011 |
| TW | 201132260 | 9/2011 |

* cited by examiner

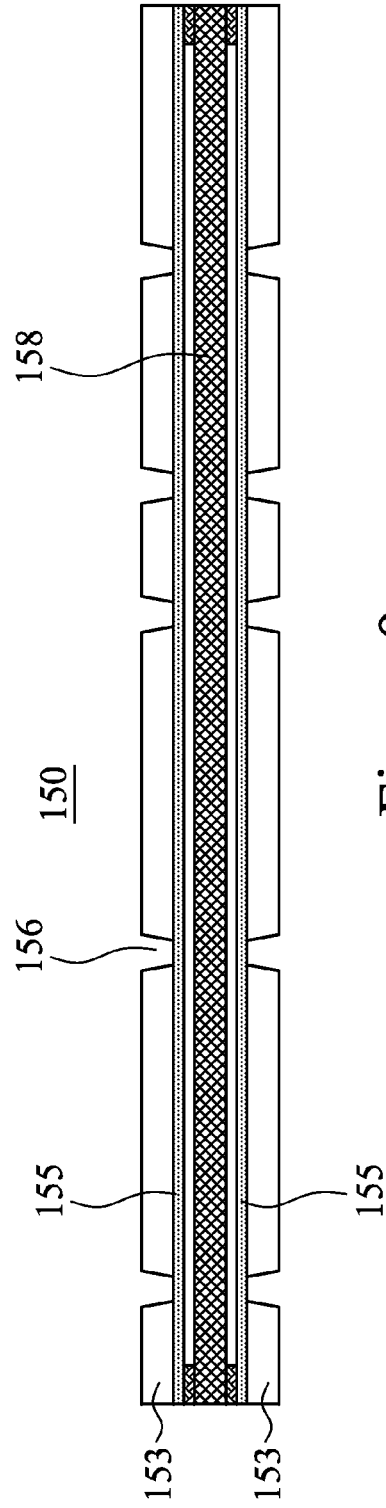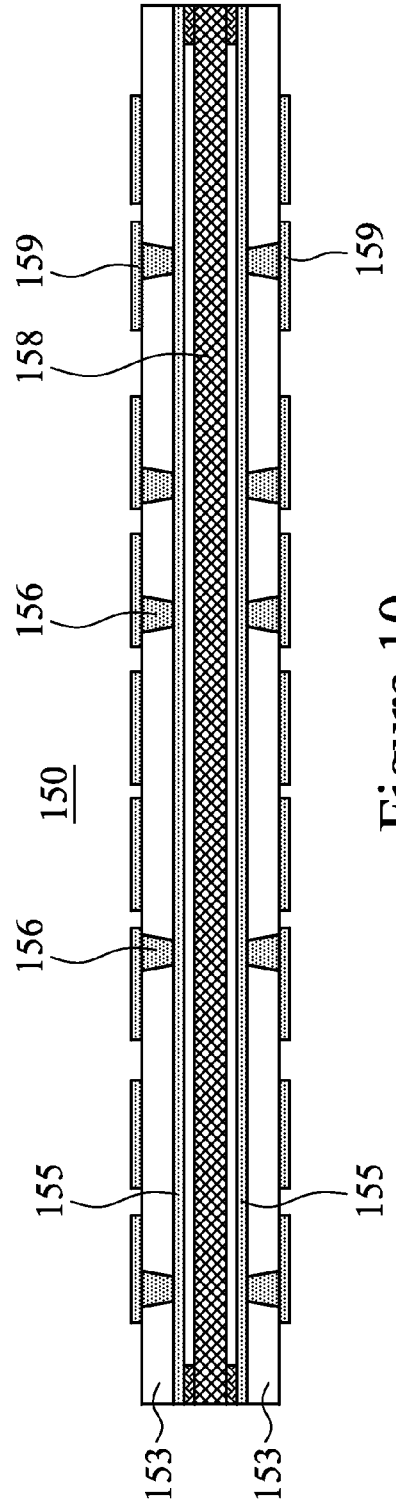

METHODS AND APPARATUS FOR THINNER PACKAGE ON PACKAGE STRUCTURES

PRIORITY CLAIM AND CROSS-REFERENCE

This application is a divisional of U.S. patent application Ser. No. 13/350,499, entitled "Methods and Apparatus for Thinner Package on Package Structures," filed on Jan. 13, 2012, which application is incorporated herein by reference.

BACKGROUND

As devices manufactured using integrated circuits continue to shrink, the need for smaller packages for the integrated circuit devices continues to increase. One approach increasingly used to save space on a system circuit board and to reduce the board area used is to provide two or more integrated circuits in a combined, vertically arranged package structure called a "Package on Package" or "PoP" device. The PoP structure reduces the system circuit board area needed for the integrated circuits by combining them into a single package structure, and also eliminates the need for some of the connector traces on the circuit board that would otherwise connect the devices to each other. Through via connections may be used to provide electrical connections between the vertically arranged packaged devices.

For example, a memory module may be the device mounted on an upper package in a PoP structure. The memory module could include one, two or more commodity memory devices such as DDR DRAM, or FLASH devices, as non-limiting examples. The upper package substrate may be a multiple level circuit board, and may be formed of a resin, for example woven glass reinforced epoxy resin such as FR4 or BT resin, ceramic, plastic, film, or other substrate materials.

The bottom surface of the upper substrate may have one or more rows of PoP connectors extending vertically away from the bottom surface of the top substrate. These PoP connectors provide the connections to either the integrated circuit mounted on the bottom package of the PoP device, or, to connections that will be mapped to the system board when the PoP device is finally mounted on the system circuit board.

The bottom package is a substrate with an integrated circuit mounted on it. The integrated circuit may be an "application processor" or "AP". The upper surface of the bottom package has lands or pads for receiving and electrically connecting to the PoP connectors. For example, if the PoP connectors are rows of solder balls extending from the bottom surface of the upper package, lands or pads on the upper surface of the bottom package will correspond to, and receive, those connectors.

The bottom package of the PoP structure will also have external connectors on it, typically on the bottom side, for making the final connection between the PoP structure and the system circuit board. The bottom package may be a ball grid array ("BGA") type package and have solder balls arranged in an array on the bottom surface. Thus the PoP device has PoP connectors between the top substrate and the bottom substrate, and, external connector terminals extending from the bottom substrate that are mounted on pads on a system circuit board.

However, as the need for higher performance and higher frequency operation devices increases, the routing used in the PoP structures has become a significant limiting factor. The signal paths, which may include board traces, solder balls, solder bumps or C4 connectors, and bond wires, used to get signals from the devices in the PoP structure to and from the system board are quite long. These paths create IR drops and result in slower systems. Further, the use of PoP devices in portable applications increases the need for ever thinner packages.

BRIEF DESCRIPTION OF THE FIGURES

For a more complete understanding of the present invention, and the advantages thereof, reference is now made to the following descriptions taken in conjunction with the accompanying drawings, in which:

FIG. 9 depicts in a cross-sectional view an intermediate process step for forming an embodiment substrate;

FIG. 10 depicts in a cross-sectional view the embodiment substrate of FIG. 9 following additional processing;

The drawings, schematics, and diagrams are illustrative and not intended to be limiting, but are examples of embodiments of the invention, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed concepts of the application, and do not limit the scope of the disclosure and do not limit the scope of the appended claims.

Embodiments of the present application, examples of which are now described in detail, provide novel methods and apparatus for PoP structures with reduced thickness and shorter signal routing length. The shorter routing distances of the embodiment PoP structures are particularly advantageous in forming packages for high frequency or high performance devices, however, advantageous use of the embodiments are not limited to those applications. The thinner PoP structures that are obtained using the embodiments are advantageous for providing a thinner overall form factor, which increasingly is demanded for hand held and portable devices such as smartphones, tablet computers, e-readers, PDAs, portable video and music players, cameras, hand held web browser or video receivers, and the like.

Figure 1:
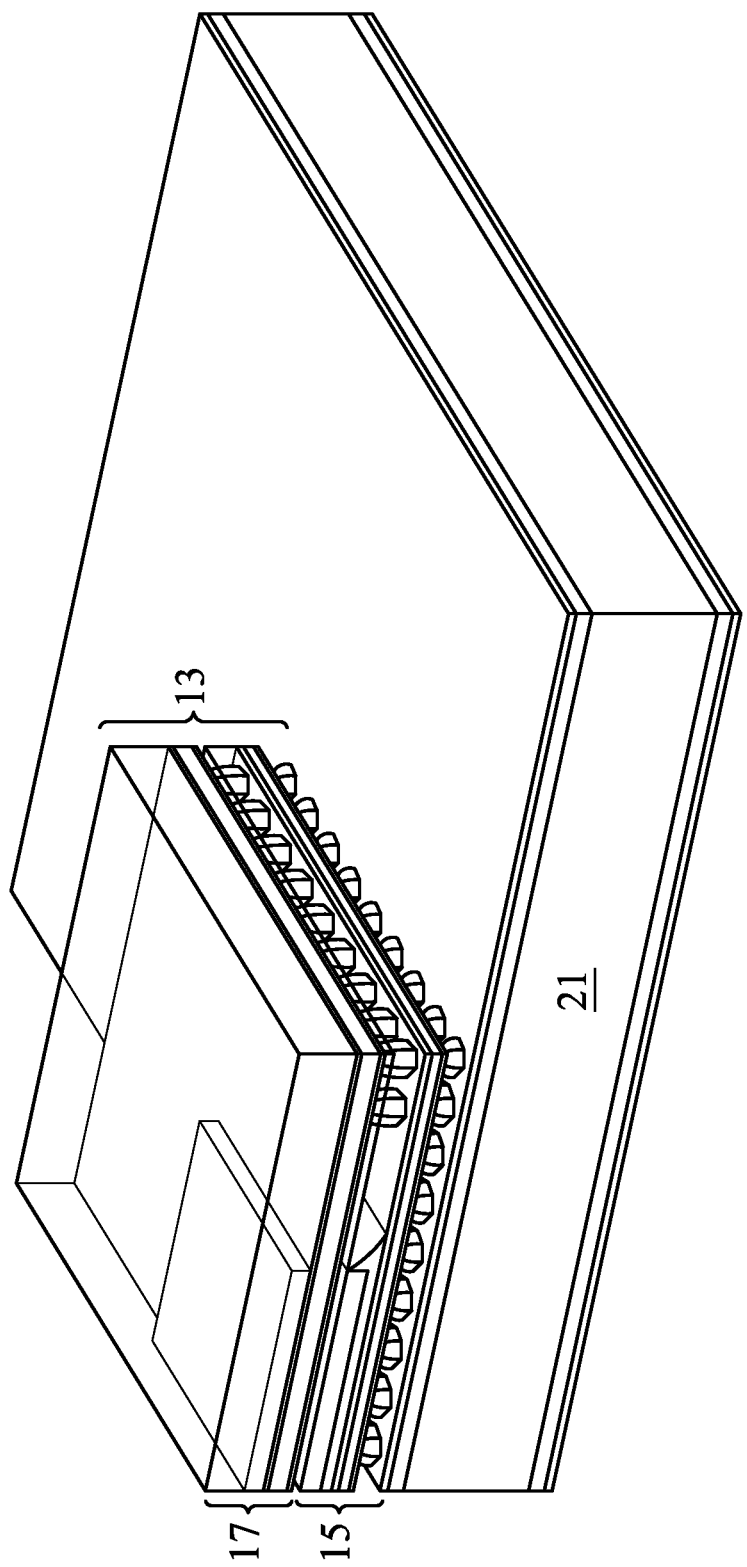
FIG. 1 depicts in a three dimensional view a section of a printed circuit board with a PoP device mounted thereon.

FIG. 1 depicts, in a three dimensional view, a quarter section of a conventional PoP structure 13 that includes a ball grid array ("BGA") package 15 as the bottom package; and an upper package 17 mounted over the BGA package in a PoP structure. External connectors extending from the bottom surface of the upper package 17 in FIG. 1 connect to lands or pads on the upper surface of the BGA package 15.

The embodiments described in this application have connectors extending from the bottom of the upper package to lands on the upper surface of the bottom package of the PoP structures. In some embodiments, these connectors may be formed as solder balls. However, the embodiments and the various applications for the embodiments are not so limited. Copper connectors, such as copper columns, pillars, or studs, controlled collapse chip connectors ("C4"), copper or solder bumps, and columns of other conductive material may all be used instead of, or along with, the solder balls shown as the example connectors in the figures. Further, the term "solder" as used herein includes both lead containing and lead-free solders. Lead containing solders such as Pb/Sn compositions, and lead-free solders including without limiting the embodiments SnAgCu ("SAC") compositions for example, are within the term "solder", which also includes other solder compositions such as eutectics. Various platings and coatings may be used to improve the solderability, reduce oxidation, improve adhesion, improve reflow processes, or improve other characteristics of the connectors. All of these variations are contemplated as alternative embodiments of the embodiments discussed herein, and these alternatives also fall within the scope of the appended claims.

In FIG. 1, the PoP structure 13 is mounted on a system board 21. System board 21 may be, for example, a printed circuit board. The PoP structure may be mounted using the ball connectors to couple to lands on the system board 21 in a thermal reflow process. In the reflow process the BGA balls are first placed in alignment with the lands on the system board 21 which are formed in a correspondence to the BGA balls, the PoP structure is moved to put the BGA balls in contact with the lands on the system board 21, and a thermal process is used to cause the BGA balls to melt and reflow and mechanically bond with the circuit board, completing both an electrical and a mechanical connection of the PoP structure to the circuit board. Adhesives may be used to further add mechanical strength, and underfill materials may be used to provide stress relief to the connection between the PoP structure 13 and the system board 21.

As the number of input and output connections for devices increase, the use of these devices in the conventional PoP structure results in thicker structures. As the PoP structure gets thicker, the distance of the paths from the devices on the upper package to the system board increases. A signal path may include a bond pad, bond wire, traces on the upper package, a through hole via through the upper package, a solder ball or copper column connector to the lower package, a solder bump and solder pad to the integrated circuit on the lower package, another through hole via and another solder ball to the system circuit board. This path may have significant voltage drop from the current-resistance ("IR") in the path. Also, the package height becomes an issue in designing very thin, hand held and portable devices where a thinner package is required. A typical PoP structure as in FIG. 1 may be greater than 1.2 millimeters in thickness. This thickness may be too large for certain thin device applications.

Figure 2:
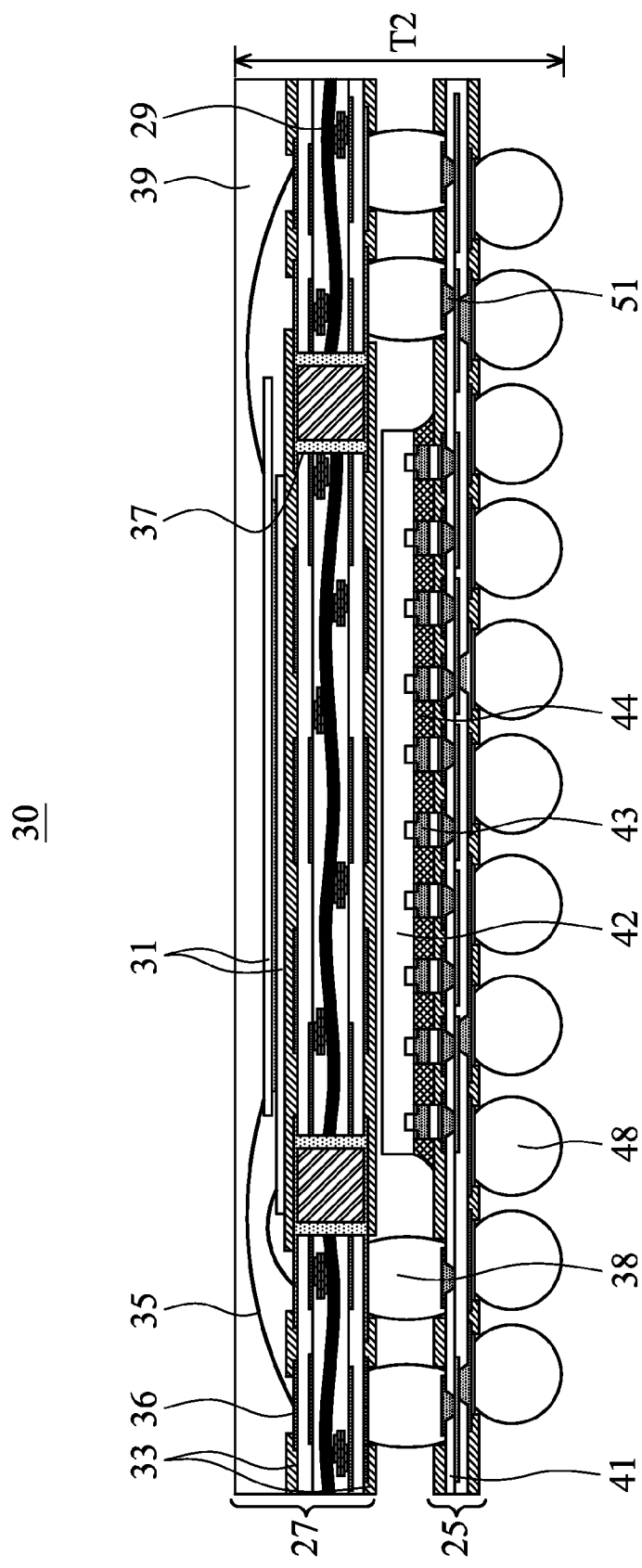
FIG. 2 depicts in a cross-sectional view an embodiment PoP structure.

FIG. 2 depicts in a cross-sectional view a first embodiment of an improved PoP structure 30. In FIG. 2, an upper package 27 is provided having a substrate 29. This substrate may be a "core" of a woven glass reinforced epoxy resin. Other substrate materials may be used including, without limitation, BT resin, for example. Materials used in printed circuit board construction such as FR4 may be used for the substrate 29. The core has layers of dielectric material separating conductive traces to form a multiple layer circuit board. For example, a pad 36 for receiving a bond wire 35 is shown overlying a dielectric layer. Vias and contacts may be used to vertically couple the traces to provide routing and mapping connections. Through vias may be used to provide vertical paths for signals through the substrate, such as through via 37, which is formed as a hole extending through the substrate 29 that is then filled, or lined, with conductive material to complete a vertical connection path. Traces on the bottom surface of upper package 27 then provide a way to further couple signals to the through via 37 and up to the upper side of upper package 27. The upper package 27 has a solder mask layer 33 on both the upper surface and the lower surface. Also shown in FIG. 2 is a passivation layer 39, which may be an overmolded layer formed, for example, by compression molding of a thermoset molding compound, to protect the through via 37, the bond wires 35, and the pads 36 from moisture and thermal stresses. Other overmolding materials may be used such as resins and epoxies.

The upper package 27 may carry, as an illustrative but non-limiting example, commodity integrated circuit devices 31 such as memory devices. In this embodiment, devices 31 may be FLASH, SRAM or DRAM devices. These are shown stacked as two stacked dies. More dies may be mounted to increase the size of the memory provided, or alternatively only one die may be used. Other types of devices may be mounted on substrate 29 as well. In FIG. 2, bond wires such as 35 are shown coupling the devices 31 to the pads such as 36 on substrate 29. However, in alternative arrangements, the bottom memory die may be a "flip chip" and may be bonded to lands on the central portion of the substrate 29 using solder bumps, or copper connections. In some embodiments a memory module of several vertically stacked dies may be formed as a component, using for example through via connections to couple the stacked memory devices to form a memory module, and the bottom die in the module may be flip chip mounted to the substrate 29. All of these arrangements are alternative embodiments contemplated as part of the embodiments, and fall within the scope of the appended claims.

Connectors 38 form the PoP connectors for the structure of FIG. 2. These connectors 38 may be solder or other conductive materials. They may be solder balls, as shown in FIG. 2, but the embodiments are not limited to the use of solder balls, the connectors could be copper columns, copper studs, controlled collapse chip connectors ("C4"), or other connectors used for connecting components to an underlying board or device. Further, the term "solder" as used in this description is not limited to any particular type and lead containing, or lead free, solder may be used. A solder ball of lead and tin (Pb/Sn) or Pb and additional materials may be used. In the alternative, lead free compositions including, as a non-limiting example, tin, silver and copper ("SAC") may be used. Eutectic compositions may be used to form the connectors. The shape of the connectors 38 is also not limited to a "ball" shape and columns, pillars, ovoids, towers, squares, rectangles and other shapes may be used.

In the embodiment of FIG. 2, the PoP connectors 38 are arranged in rows at the periphery of the substrate 29. This arrangement leaves space in the central portion of the bottom surface of the upper package 27 for a chip mounted beneath it to be placed inside the vertical space provided by the connectors 38, and adjacent to the bottom surface of the upper package 27. In this manner, the thickness T2 for the PoP structure 30 is reduced. As will be further described below, in additional embodiments, this vertical spacing can be still further reduced by various additional modifications.

In FIG. 2, it should be noted that the upper package could be used in applications other than the PoP structure 30. The connectors 38 may be mounted to a circuit board, for example, and the memory devices 37 could be used in other applications. Thus, the upper package 27 has utility other than for the embodiments discussed here.

In FIG. 2, a "coreless" bottom package 25 is shown beneath the upper package 27. This package forms the "BGA" part of the PoP structure and carries an application processor or "AP" 42. AP 42 may be, without limitation, a microprocessor. Alternatives for AP 42 include the use of application specific integrated circuits ("ASICs"), digital signal processors ("DSPs"), a radio transceiver IC, or other functional device that performs selected desired functions. If the AP 42 is a processor or microprocessor, then it can be seen that the memory devices 31 may be program storage, or cache, associated with the AP 42; thus, the use of the PoP structure 30 provides a "system" for use in a device. The system of the PoP structure 30 then includes several integrated circuits but requires only one portion of the system circuit board.

The bottom package 25 is built on a coreless substrate 41. This package does have some of the features of the upper package 27; for example, conductive traces and dielectric layers are shown with vias and contacts, and a solder mask is used to protect the upper and lower surfaces of the substrate 41. But the substrate 29, or "core", used in the upper package 27 is now omitted. As will be further described below, some of the embodiments of the PoP structure disclosed herein use a novel method for manufacturing a coreless substrate with reduced thickness, as 41 in FIG. 2.

The thickness T2 of the PoP structure 30 is reduced from the thickness a conventional PoP device would achieve. Reducing the thickness by omitting the "core" has several advantages. The path lengths from the devices such as 31 and 42 to the system board connections are shortened. Since each path is a voltage drop caused by the product of current through the path multiplied by the resistance of the path ("IR"), a shorter path has a lowered "IR" drop. Further, the shorter paths allow for shorter delay times in signal travel, and thus, allow for higher frequency of operation. The package is also physically thinner as a result of the use of the coreless substrate, which allows for a thinner system package.

In FIG. 2, AP 42 is shown mounted to the coreless substrate 41 using a "flip chip" approach; that is, the bond pads on the face of the AP 42 are "flipped" over so it is "face down", and the bond pads are connected to traces on the substrate 41 with conductive material. In this particular embodiment, which is not limiting is but one alternative, a "board on trace" or "BOT" connection is used. Copper connectors are formed on the bond pads of AP 42. These are connected directly to the copper traces on the upper surface of substrate 41, forming an electrical connection. Using a BOT approach allows for a finer pitch (smaller spacing between bond pads) of the connections as compared to the more conventional "SOP" or "solder on pad" approach. The SOP approach requires more space between pads formed on the traces, to allow the solder on the pads to reflow with the solder bumps that are then be used on the AP 42. However, SOP embodiments may be used to mount AP 42 to substrate 41, and for certain applications this approach may have advantages. All of these alternatives are within the scope of the appended claims.

An underfill material 44 is shown between the BOT connections underneath the AP 42. The underfill is typically dispensed as a liquid using a capillary underfill ("CUF") approach. A resin or epoxy liquid is flowed beneath the AP 42 and fills the spaces between the connectors. Room temperature, UV, or thermal curing may be used to cure the material. The underfill provides mechanical strength and stress relief.

Lands or pads 51 on the upper surface of the coreless substrate 41 receive the PoP connectors 38, which in this embodiment are solder balls. These connectors may be coupled to traces that connect the devices 31, for example, to the AP 42, or to the external connectors 48 (shown in this embodiment as solder balls) for connection to the system. Through vias may be formed in substrate 41, or vertical connections may be made through a via to an internal trace within the substrate, through another via to a trace on the other surface of the substrate 41.

External connectors 48 may be solder connectors such as solder balls. These solder balls may be arranged in a grid pattern of rows and columns and may cover most of the bottom surface of the substrate 41. The external connectors thus form a "ball grid array" or "BGA" and the bottom package 25 may be referred to as a BGA package. The bottom package 25 may also have utility other than the PoP structure 30; that is, the bottom package 25 provides a package for AP 42 which may be used in the PoP structure with memory devices on a PoP package, for example, or bottom package 25 may be mounted to a circuit board without the PoP package.

Figure 3:
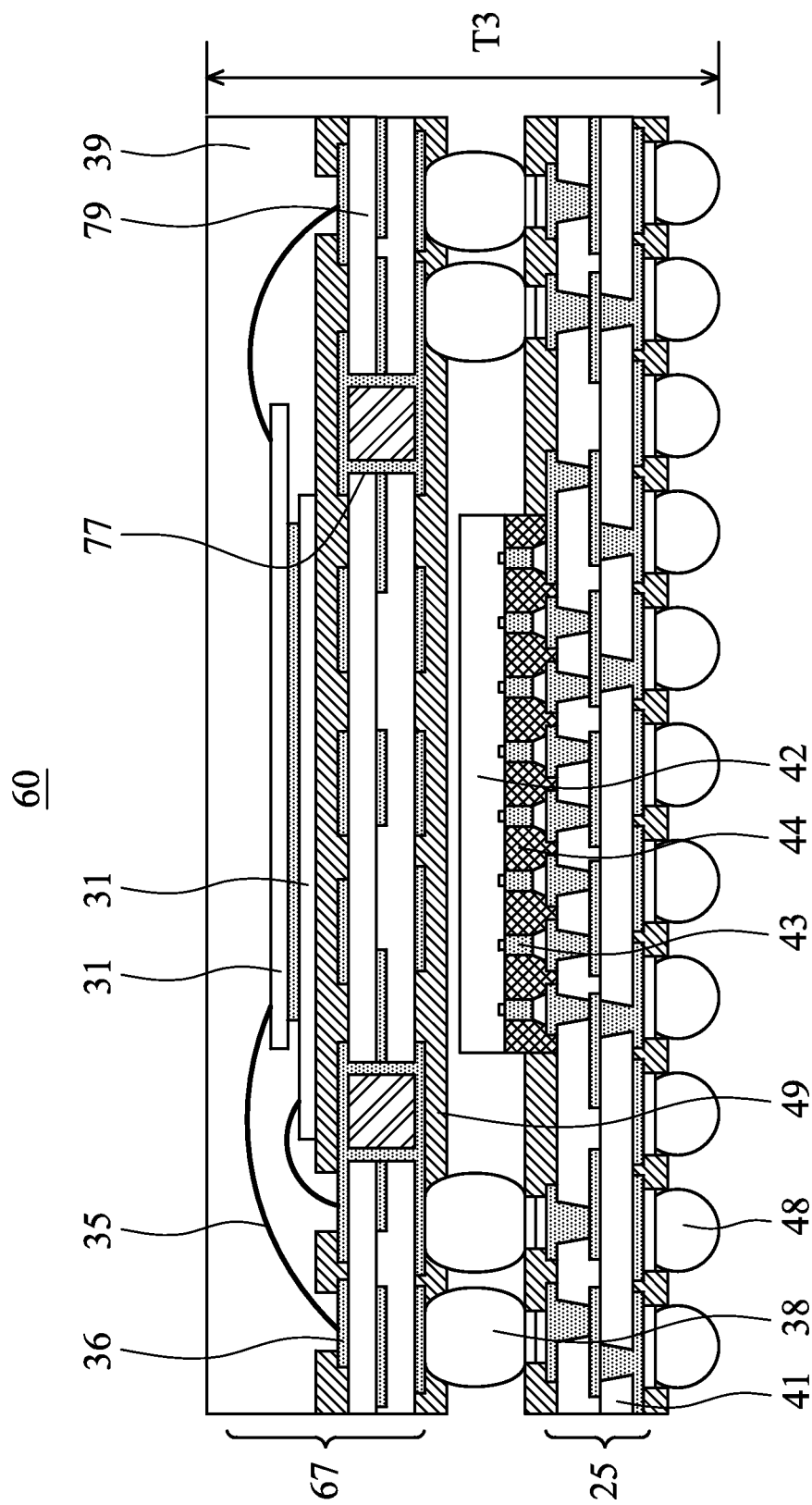
FIG. 3 depicts in a cross-sectional view another embodiment PoP structure.

FIG. 3 depicts an alternative embodiment PoP structure 60 in a cross-sectional view. Many of the elements of FIG. 2 are shown again in FIG. 3, and for those elements, like reference numerals are used.

In FIG. 3, the upper package 67 is now also formed on a coreless substrate 79. This substrate is formed of a plurality of dielectric layers that may be formed, for example, using a method embodiment that is described below. The layers carry conductive traces and contain vias so that using vias and contacts to the conductive traces, a multiple layer circuit board may be formed of coreless substrate 79. A through via 77 is shown providing electrical connection between the upper surface and lower surface of substrate 79. The coreless substrate 79 is thinner than the substrate 29 in FIG. 2; thus, the PoP structure 60 has a thickness T3 that is less than that of T2 for FIG. 2, where only the lower package was coreless. Here, both the upper and lower packages 67 and 25 are coreless. The remaining elements of FIG. 3 are identical to FIG. 2. The space 49 of FIG. 3 above the AP 42 and below the upper package 67 is optional; the space could be smaller or no space provided as in FIG. 2 as well. The thickness T3 achieved in this embodiment is also less than the thickness that can be achieved using a conventional PoP structure.

Figure 4:
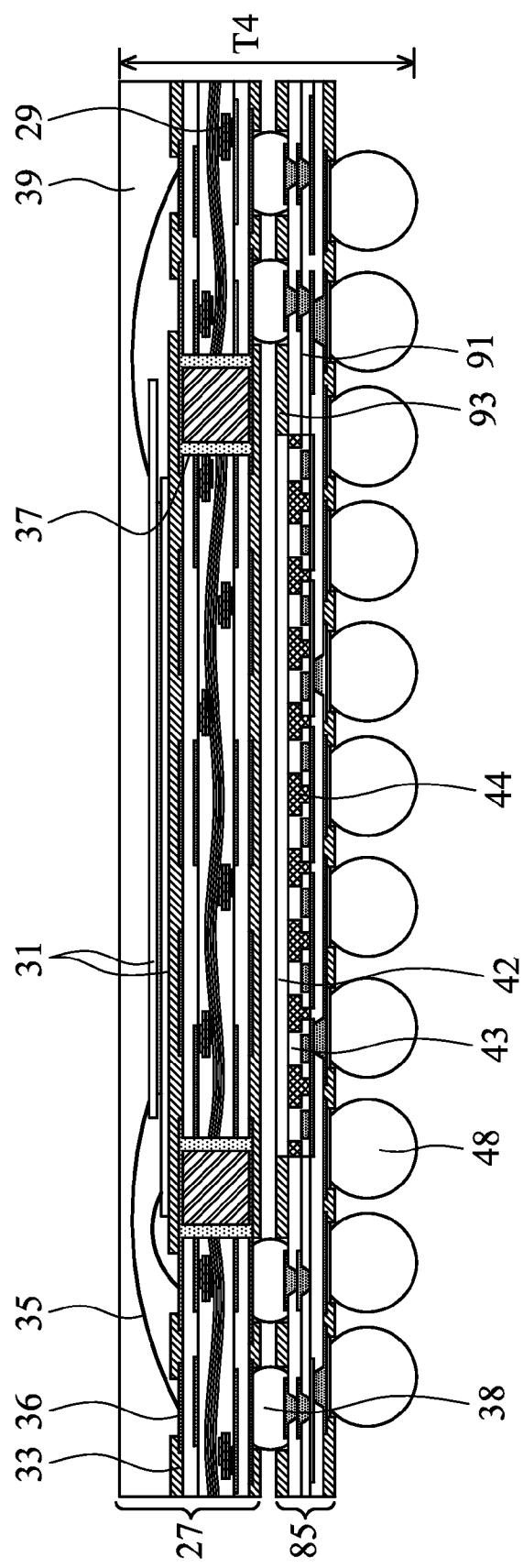
FIG. 4 depicts in a cross-sectional view an alternative embodiment PoP structure.

In FIG. 4, a further alternative PoP structure 80 is depicted in another cross sectional view. Many of the elements are identical to those of FIG. 2 and like reference numbers are used for like elements.

In FIG. 4, the upper package 27 is the same as in FIG. 2, with devices 31, bond wires 35, pads 36, solder mask 33, and through via 37 on a cored substrate 29.

The lower package is now referenced as 85, to distinguish the differences in the embodiment as compared to FIG. 2. The lower package 85 has a coreless substrate 91, which has an embedded chip 42 in it. This AP 42 may be the same type of device as in FIG. 2, but in this embodiment, the AP 42 is embedded in the substrate 91; that is, the body of the AP 42 lies within the thickness of coreless substrate 91 instead of being disposed on top of it. PoP connectors 38 can therefore be made thinner and the PoP structure 80 can have a thickness T4 much less than the conventional approach to a PoP structure. AP 42 is depicted mounted as a BOT connected device within a cavity formed in the coreless substrate 91, so that the upper surface of the AP 42 and the upper surface of the solder mask 93 lying over the substrate 91 may be substantially co-planar, although this feature is not required. Alternatively, the AP 42 may also extend vertically above the solder mask surface.

The upper package 27 in FIG. 4 is identical to the upper package 27 in FIG. 2, like reference numerals are used and no further description is needed here.

Figure 5:
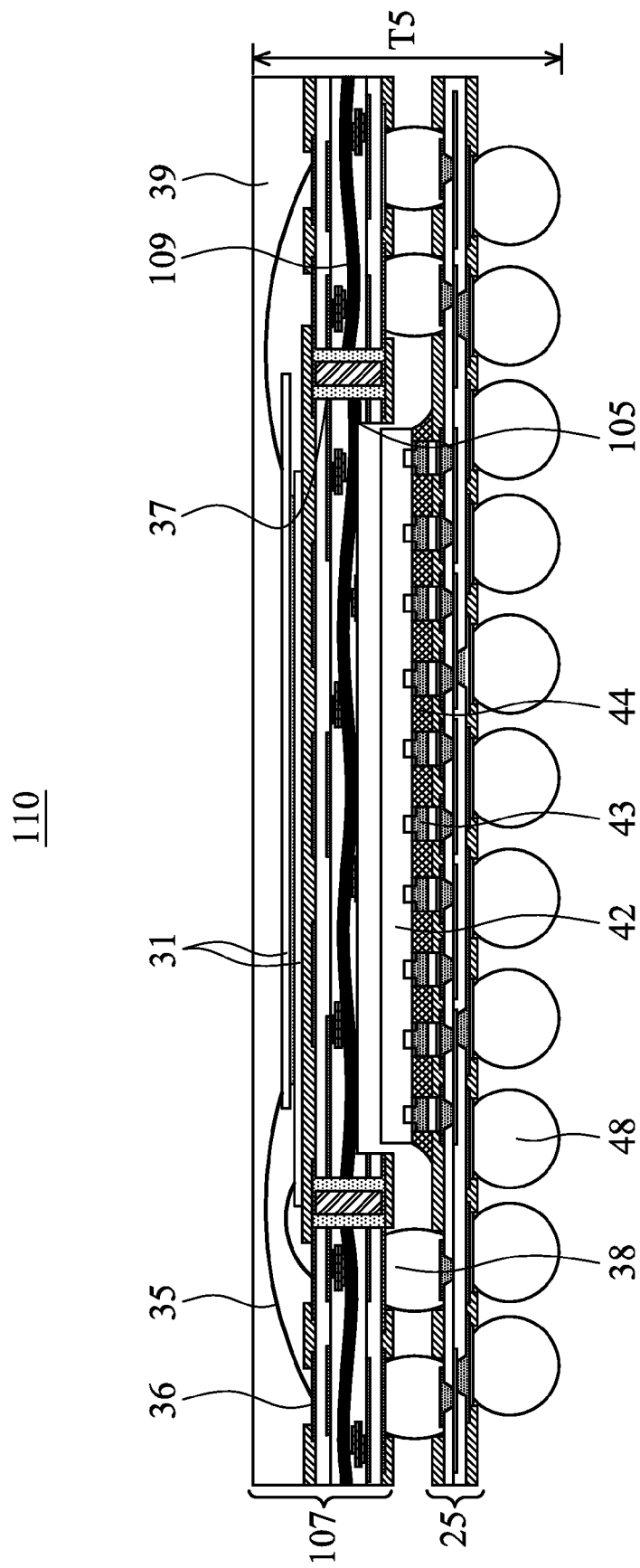
FIG. 5 depicts in a cross-sectional view another alternative embodiment PoP structure.

FIG. 5 depicts in a cross-sectional view a PoP structure embodiment 100. In this embodiment, the upper package is renumbered 107 to distinguish this embodiment from the upper package 27 of FIG. 2, for example. In FIG. 5, the upper package 107 is formed of a core substrate 109 which may be, for example, a woven glass reinforced epoxy resin substrate. A cavity 105 is formed on the bottom portion of the substrate 109. This "cavity down" arrangement allows the body of the AP 42, which is mounted on the lower package 25, to extend partially into the cavity within the body of the upper package 107, and so the thickness T5 is again able to be greatly reduced from the thickness that a conventional PoP structure would have. The reduced vertical area needed for the AP 42 allows the PoP connectors 38 to be reduced in thickness also.

The remaining elements of FIG. 5 including the lower package 25 which is a coreless substrate package as in FIG. 2, the devices 31 on the upper package, the AP 42, the external connectors 48, are the same as in FIG. 2 and like numerals are used. The remaining features of the embodiment 100 are the same as for the PoP structure 30.

Figure 6:
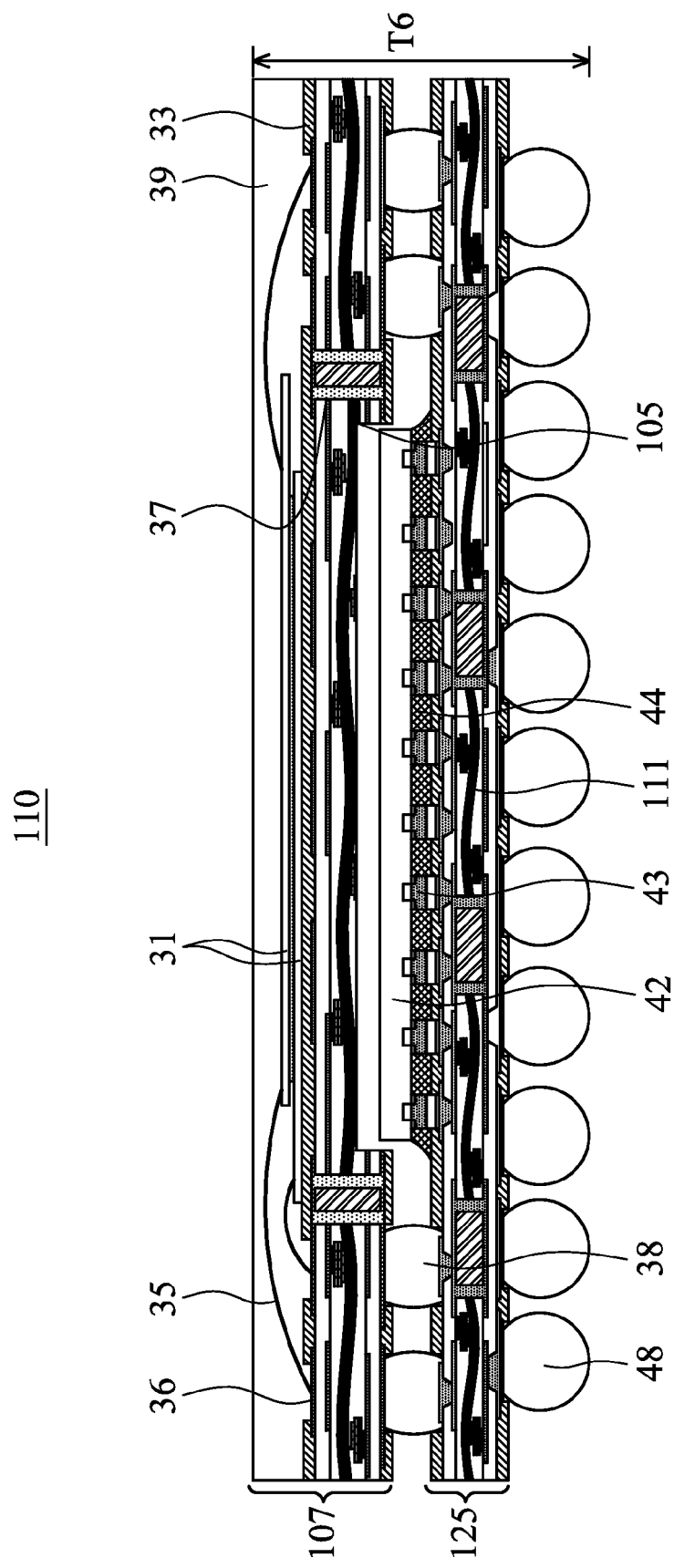
FIG. 6 depicts in a cross-sectional view yet another alternative embodiment PoP structure.

FIG. 6 depicts another embodiment 110 in a cross-sectional view. In FIG. 6, PoP structure 110 has the same "cavity down" upper package as that in FIG. 5 for upper package 107. The lower package 125 is now a cored substrate such as a FR4 substrate with woven glass reinforced epoxy resin 111. The remaining features of FIG. 6 are identical to those in FIG. 5 and like reference numerals are therefore used. The thickness T6 of structure 110 is lowered by the use of cavity 105, as in FIG. 5; however the lower PoP package 125 is now a conventional "cored" substrate 111. The use of the cavity down upper package 107 again allows the thickness T6 of the structure 110 to be less than the thickness that could be achieved in a conventional PoP structure.

Figure 7:
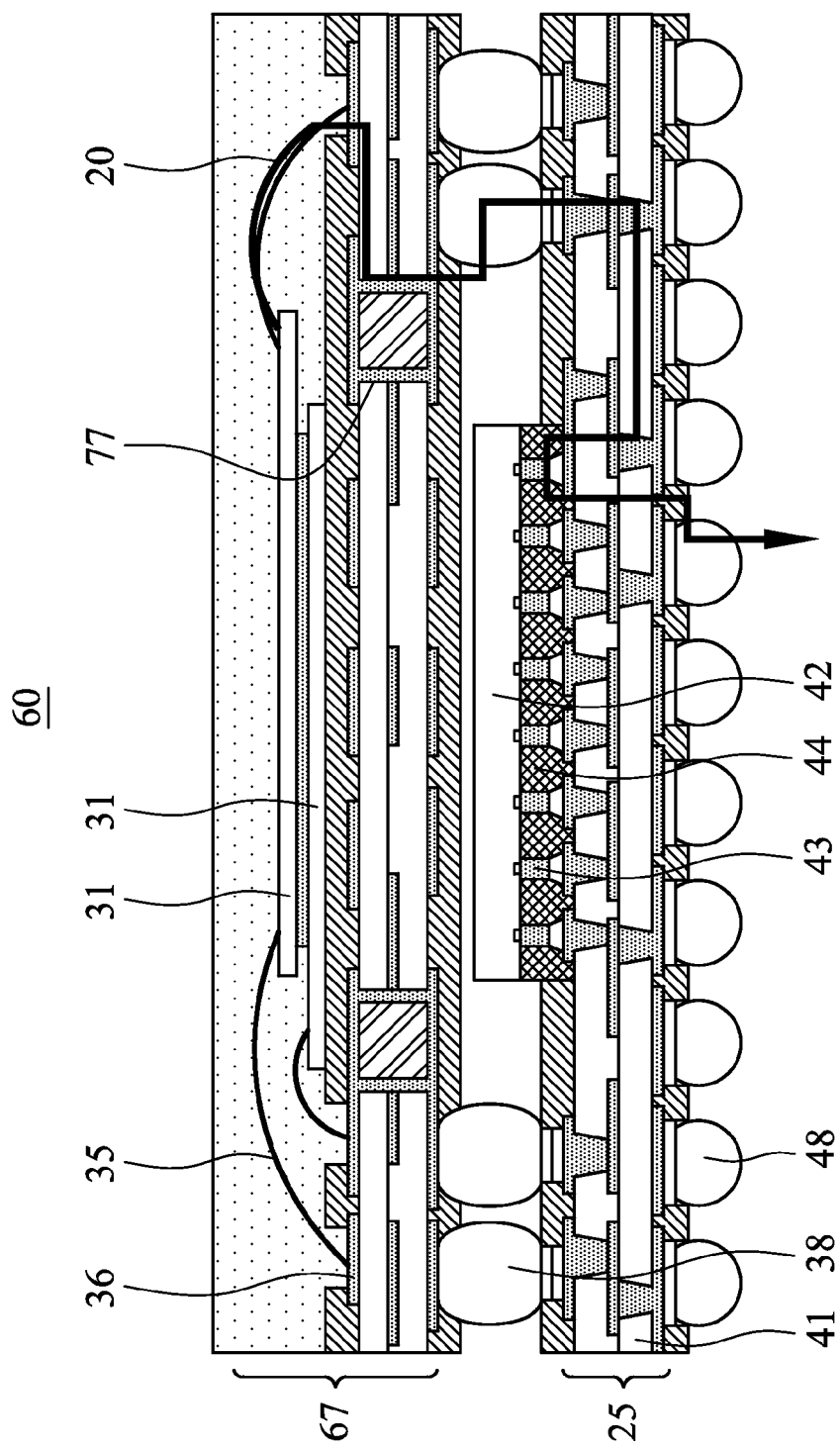
FIG. 7 depicts the cross sectional view the embodiment of FIG. 2 and illustrates a signal path for the embodiments.

FIG. 7 depicts the embodiment 60 of FIG. 2 and further illustrates an example signal path 20 for the devices in the embodiment. The signal path 20 illustrates a path from a device 31 to the upper substrate by a bond wire 35, to a copper trace, through a via 77 to the lower surface of the substrate. The signal path continues through a solder ball connector 38 to a trace in the coreless substrate of the lower package 25, to the AP 42, then through a via in the lower package, to a solder ball 48 and on to the printed circuit board. The vertical portions of the signal path are shortened by the reduced thicknesses achieved by the use of the coreless substrates and the BOT mounting of the embodiments, which greatly reduces the IR drop for the signal paths, improving device performance.

Figure 8:
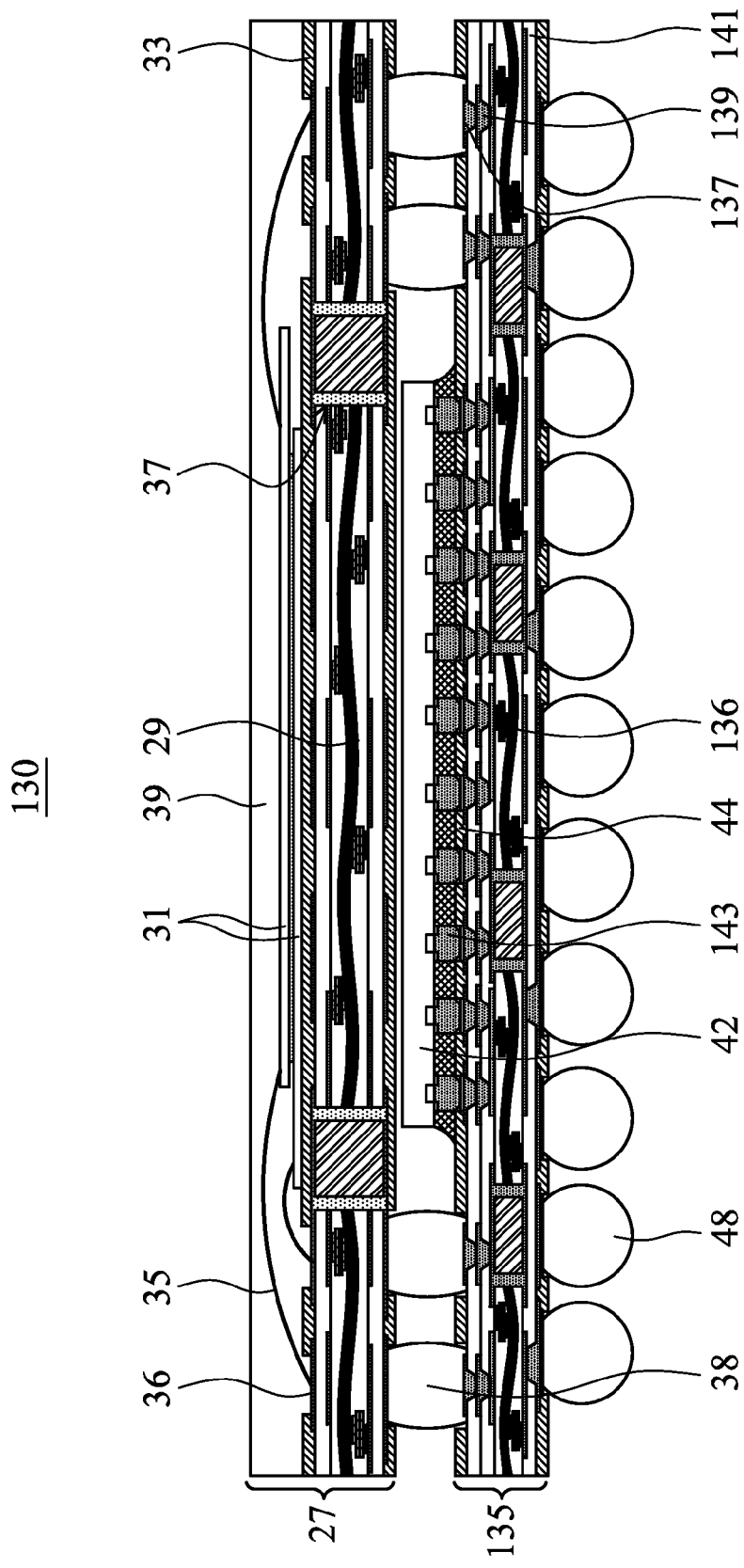
FIG. 8 depicts in a cross-sectional view another embodiment PoP structure.

FIG. 8 depicts in yet another cross-sectional view an embodiment PoP structure 130 with reduced warp characteristics. Again, the upper package 27 is formed using a cored substrate 29 such as a woven glass reinforced epoxy resin like FR4, while the lower package 135 in this embodiment is also a cored substrate, numbered here as 136. This substrate 136 has an asymmetric system of circuit layers; the upper surface has, in this example, two layers of dielectric and copper traces 137, 139 stacked vertically, while on the bottom surface of this cored substrate 136, a single dielectric layer 141 is shown. In testing, this arrangement has been shown to reduce the package warp over similar structures with "symmetric" layering. The embodiments may have additional layers on the upper surface of substrate 136, or the lower surface, but in all the embodiments, the upper surface of substrate 136 has a greater number of dielectric layers than the lower surface of substrate 135. During thermal cycles and in assembly of the PoP structure, this asymmetric layer arrangement reduces the substrate warp that might otherwise occur.

The remaining features shown in FIG. 8 are identical to those in prior embodiments, and like numerals are again used for like elements. Upper package 27, including devices 31, wire bonds 35, pads 36, solder mask 33, through via 37, and cored substrate 29 are the same as in FIG. 2, for example. Lower substrate 135 is similar to cored substrate 125 in FIG. 7, except that the layers of dielectric material 137, 139 and 141 are arranged in an asymmetric fashion as described above. The connectors 48, AP 42, and PoP connectors 38 are arranged as before.

Another aspect of FIG. 8 is that the connections from the AP 42 to the lower package 135 are now shown as solder on pad or "SOP" connectors. These are numbered 143 to distinguish them from the BOT connectors 43 in other embodiments described above. However, in alternative embodiments, this asymmetric layer substrate arrangement could also be used with the BOT connectors for AP 42, as in prior embodiments in the figures above. The SOP connectors 143 have pads with solder on the substrate 135, and the AP 42 has solder bumps, enabling a solder connection to be formed by using a thermal reflow process. Underfill 43 is again provided after the AP 42 is flip chip mounted to substrate 136. SOP connections require more distance between connections (greater pitch) and thus cannot achieve the fine pitch resolution of the terminals on AP 42 that may be achieved using the BOT connections. BOT connections can support a minimum pitch distance of less than 30 microns, for example.

A method embodiment for making the coreless substrates for use with the embodiments is now described. In FIG. 9, an intermediate structure 150 for forming the coreless substrate is depicted in a cross-sectional view. A carrier 158, which may be a glass or metal carrier, is shown with two identical assemblies on either surface in an intermediate stage of the process. Layers of preimpregnated material ("prepreg") 153 are resin impregnated paper or cloth that are provided with a layer of conductive material 155, such as a copper layer, on one surface. The conductive layer 155 is adhered temporarily to the carrier 158 for processing. A laser drill or other drilling mechanism may be used to form openings 156 to expose the underlying conductive layers 155 at selected locations. These openings will become vias.

In FIG. 10 the structure 150 is depicted following additional processing steps. To transition from FIG. 9 to FIG. 10, an electroless copper is applied, lithography is used to pattern the electroless layer, electroplating is performed, and additional patterning is performed to define vias 156 and traces 159 on the surfaces of the prepreg layers 153. These traces 159 will form internal connections in a multiple layer structure for the coreless substrate.

Figure 11:
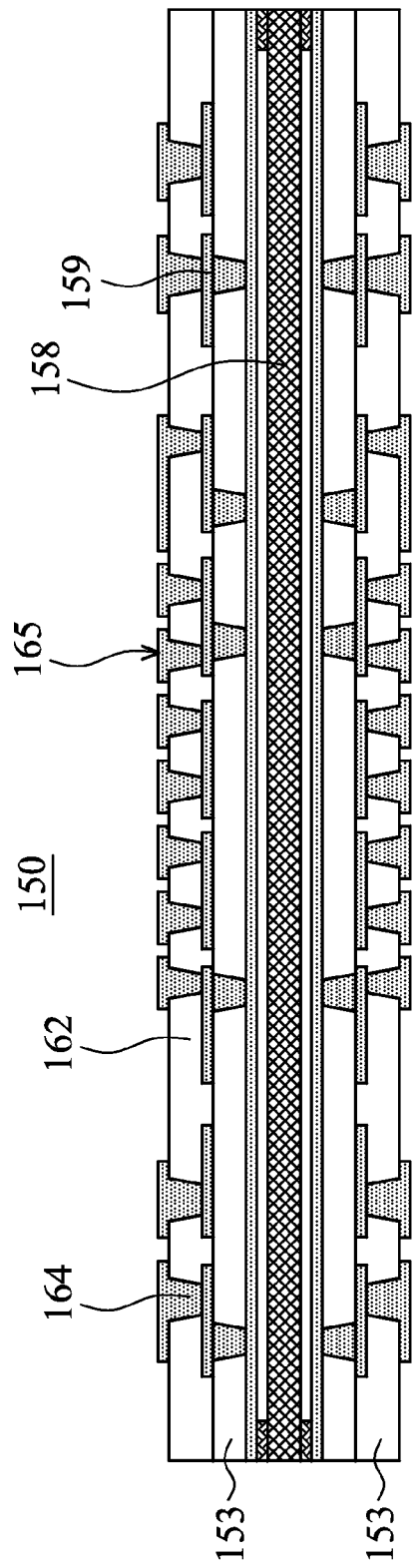
FIG. 11 depicts in a cross sectional view the embodiment of FIG. 10 following additional processing.

FIG. 11 depicts in a cross sectional view the structure 150 following additional processing. To transition to the stage depicted in FIG. 11, an additional layer of prepreg 162 is laminated to the prepreg layers 153. Additional metal processes are performed. Again, a laser is used to form openings in areas 164, which are vias. Electroless plating is performed, followed by lithographic patterning and electroplating of a copper layer, which is then patterned to form traces 165 on the outer surfaces of prepreg 162. These traces 165 will form the lands for connection to the AP 42 integrated circuit, and for the PoP connectors that are to be formed on the upper surface when the coreless substrate is used in one of the embodiment PoP structures.

Figure 12:
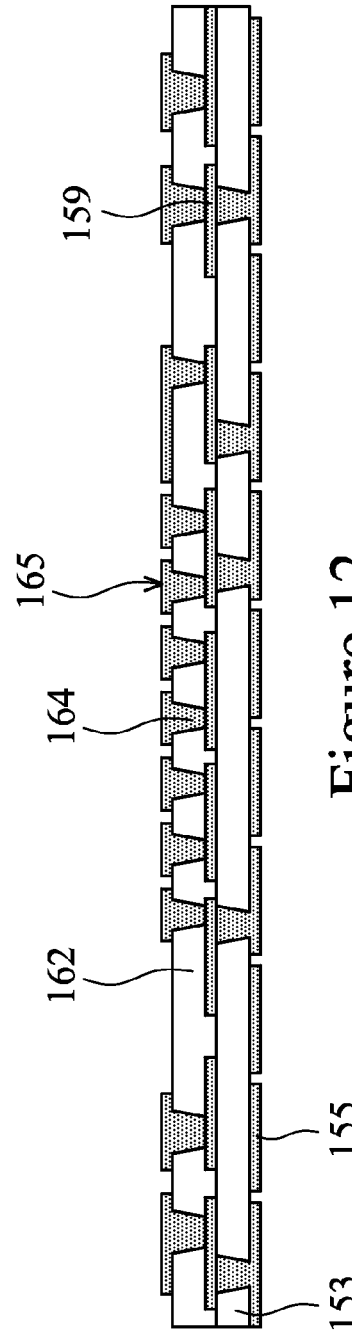
FIG. 12 depicts in a cross sectional view the embodiment of FIG. 11 following additional processing.

FIG. 12 depicts in a cross-sectional view one of the two coreless substrates of FIG. 10 following additional processing. The substrate is diced or singulated into an individual unit and removed from carrier 158, which is no longer shown. The bottom conductive layer 155 is then patterned to form lands for the BGA balls on the bottom surface of prepreg layer 153, the remaining elements such as prepreg layer 162, vias 164, and traces 165, 159 are arranged as before.

Figure 13:
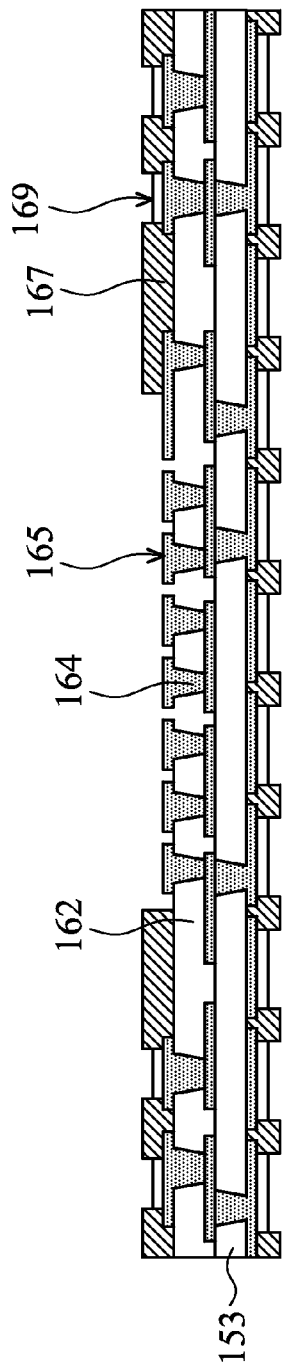
FIG. 13 depicts in another cross-sectional view the embodiment of FIG. 12 following additional processing.

FIG. 13 depicts the coreless substrate of FIG. 12 following some additional processing steps. A solder mask layer 167 is formed on both the upper and lower surfaces of the coreless substrate. The solder mask is then patterned to form openings over the traces and under bump metallization 169 is plated onto the ball lands. Traces 165 are ready for mounting the integrated circuit AP 42 as a BOT device.

Figure 14:
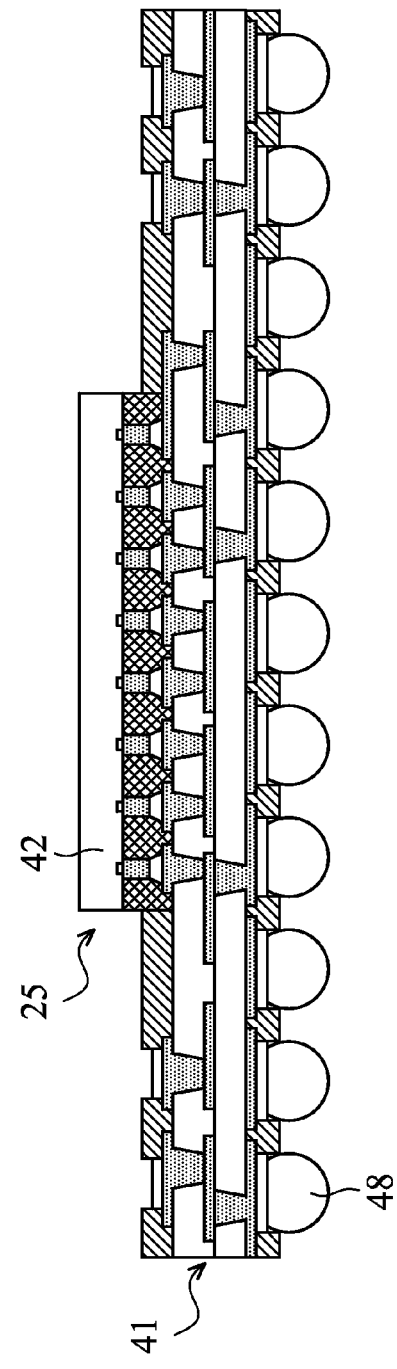
FIG. 14 depicts in another cross sectional view an embodiment PoP structure.

FIG. 14 depicts in a cross sectional view the finished assembly using the coreless substrate to form bottom package 25 as shown in FIG. 2 above. The integrated circuit AP 42 is mounted on the central portion of the coreless substrate 41. The external connectors 48, which may be solder balls, are mounted on the bottom surface. The bottom package 25 is thus a BGA package and is ready for assembly into the PoP structure 30 as shown in FIG. 2.

Figure 15:
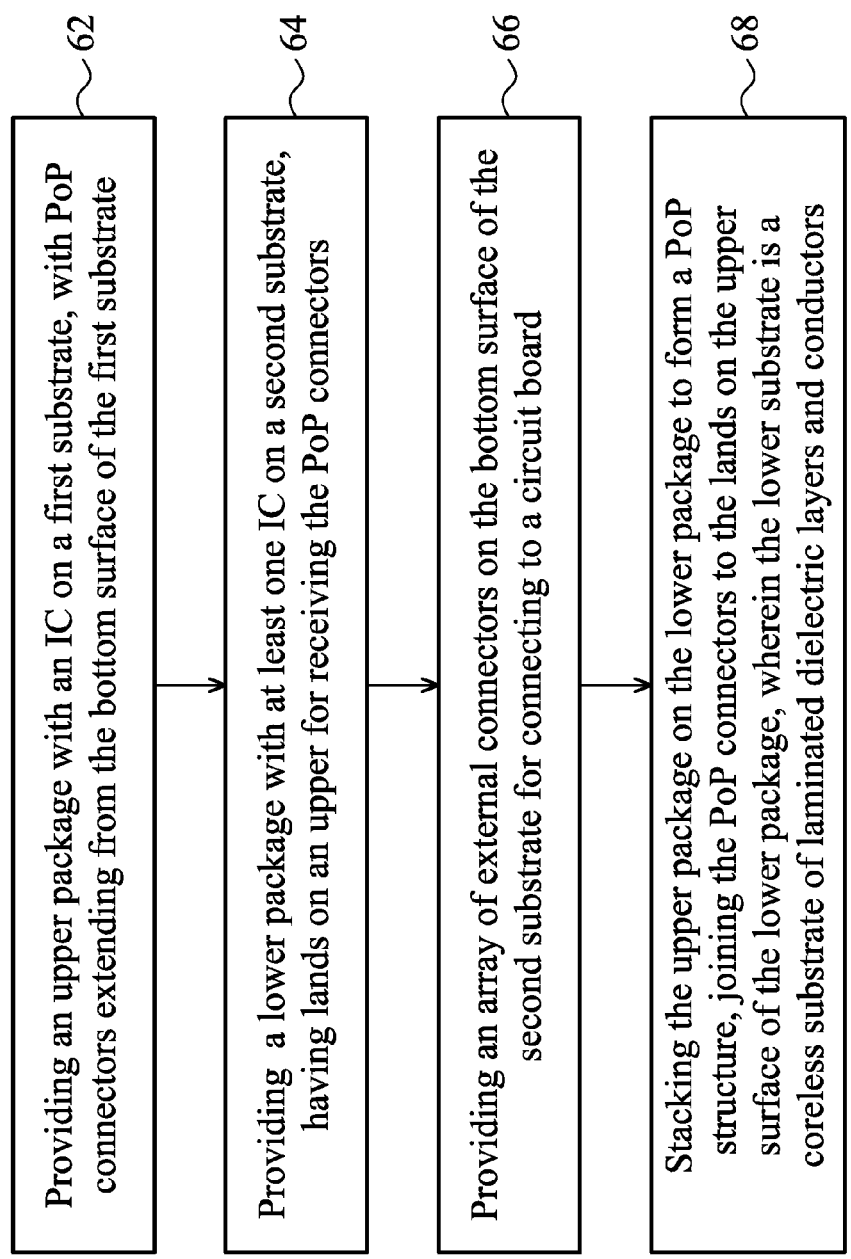
FIG. 15 depicts in a flow diagram a method embodiment.

FIG. 15 depicts in a flow diagram a method embodiment for forming the coreless substrate as shown above. In step 62, an upper package is provided with an IC mounted on an upper surface of a first substrate, with PoP connectors extending from a bottom surface of the first substrate. In step 64, a lower package is provided with at least one IC on a second substrate, with lands on an upper surface for receiving the PoP connectors. In step 66, an array of external connectors are provided on the bottom of the second substrate for connecting to a circuit board. In step 68, the upper and lower package are stacked and bonded together, and the second substrate is a coreless substrate of laminated layers of dielectric and conductors, with no intervening core.

Figure 16:
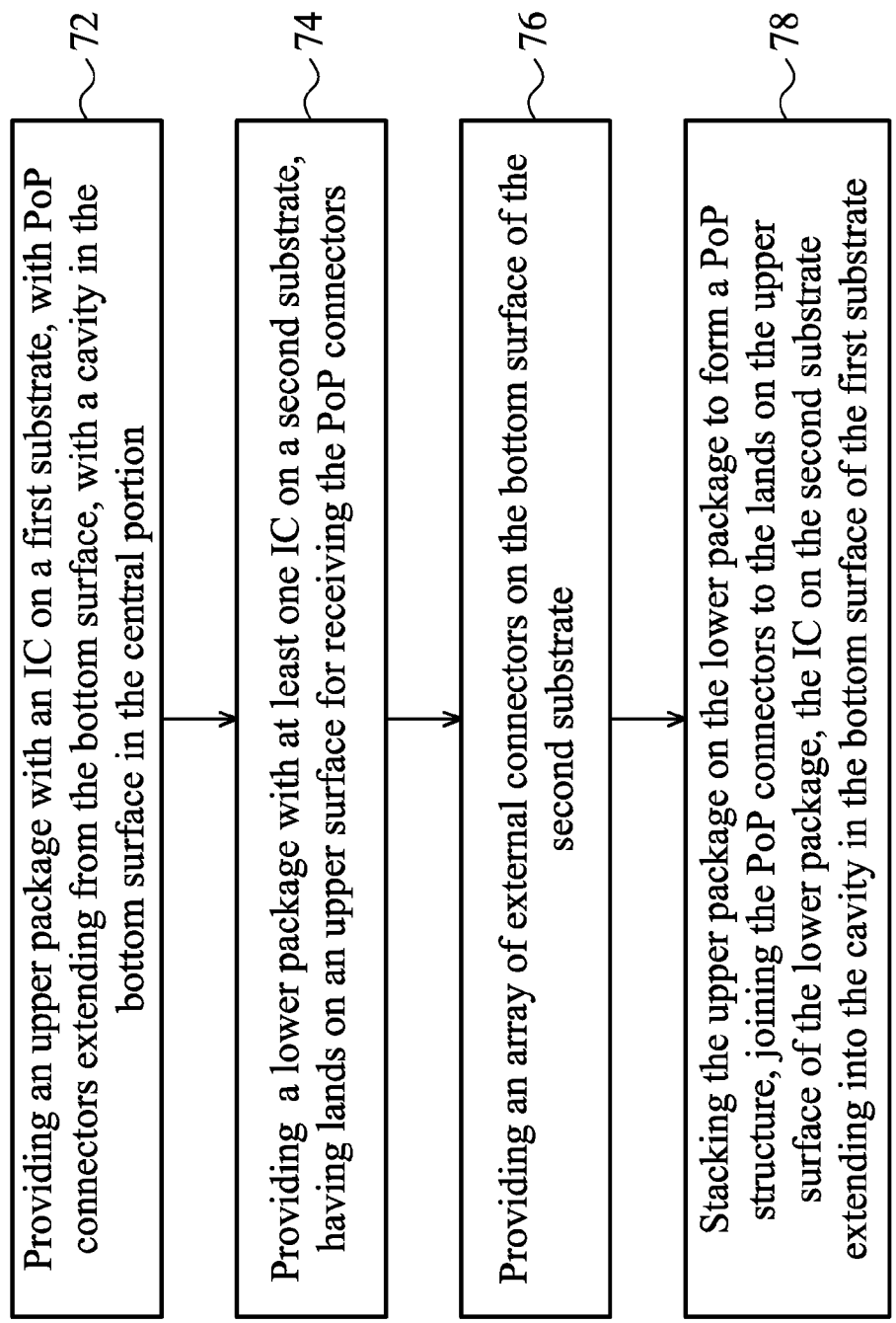
FIG. 16 depicts in a flow diagram an alternative method embodiment.

FIG. 16 depicts in a flow diagram an alternative method embodiment. In step 72, an upper package is provided with an IC on a first substrate with PoP connectors extending from the bottom surface, and a cavity is provided in the central portion of the first substrate. In step 74, a lower package is provided with at least one IC on a second substrate, having lands on an upper surface of the second substrate for receiving the PoP connectors. In step 76, an array of external connectors is provided on the bottom surface of the second substrate. In step 78, the upper package and the lower package are stacked together to form a PoP structure, joining the PoP connectors to the lands on the upper surface of the second substrate, and the IC on the second substrate extends into the cavity on the bottom surface of the first substrate. Each of the methods provides embodiments with reduced signal length and thinner PoP structures when compared to the conventional approaches. In a test vehicle, use of the embodiments enabled a PoP structure that had a thickness reduced by 30% and lowered below 1 millimeter for a package that, in a conventional PoP structure, had a thickness greater than 1.2 millimeters.

In one embodiment, a semiconductor device structure includes a first integrated circuit package having at least one integrated circuit device mounted on a first substrate, and having a plurality of package on package connectors extending from a bottom surface of the first substrate; and a second integrated circuit package comprising at least another integrated circuit device mounted on a second substrate, having a plurality of lands on an upper surface of the second substrate coupled to the plurality of package on package connectors, and having a plurality of external connectors extending from a second bottom surface of the second integrated circuit package; wherein at least the second substrate comprises a plurality of dielectric layers and conductors stacked together without an intervening core.

In another embodiment, the above structure includes wherein the plurality of package on package connectors are solder. In a further embodiment, the plurality of external connectors are solder. In still another embodiment, the first substrate includes a plurality of dielectric layers and conductors stacked together without an intervening core. In yet another embodiment, the above semiconductor device structure includes the first substrate having a first plurality of dielectric layers on a first surface of a core material, and a second plurality of dielectric layers on a second surface of the core material. In still another embodiment, the first substrate further includes a cavity formed in a central portion of the bottom surface of the first substrate. In another alternative, in the above structure, the at least another integrated circuit device of the second package extends partially into the cavity formed in the central portion of the bottom surface of the first surface. In still a further embodiment, the at least another integrated circuit device is embedded into the second substrate. In yet another embodiment, the at least another integrated circuit device is mounted to the second substrate using board on trace connectors.

In a further embodiment, in the above semiconductor device structure the at least one integrated circuit device is a memory. In still another embodiment, the at least another integrated circuit device is a microprocessor.

In a further alternative embodiment, a semiconductor device structure includes a first integrated circuit package having at least one integrated circuit device mounted on a first substrate, and having a plurality of package on package connectors extending from a bottom surface of the first substrate, and a cavity formed on the bottom surface and extending into the first substrate, the package on package connectors arranged spaced from the cavity; and a second integrated circuit package having at least another integrated circuit device mounted on a second substrate, including a plurality of lands on an upper surface of the second substrate coupled to the plurality of package on package connectors, and further including a plurality of external connectors extending from a bottom surface of the second integrated circuit package; wherein at least a portion of the at least another integrated circuit device extends into the cavity on the bottom surface of the first substrate.

In another embodiment, a method includes providing a first integrated circuit package comprising one or more integrated circuits on an upper surface of a first substrate, and providing a plurality of package on package connectors extending from a lower surface of the first substrate; providing a second integrated circuit package by providing a second substrate having one or more other integrated circuits on an upper surface of the second substrate, the second substrate including a plurality of lands on the upper surface of the second substrate arranged for receiving the plurality of package on package connectors, and further providing a plurality of external connectors extending from a bottom surface of the second substrate; and mounting the first integrated circuit package to the upper surface of the second substrate by bonding the package on package connectors of the first integrated circuit package to the plurality of lands on the second substrate; wherein providing the second substrate includes providing a plurality of dielectric layers and conductors stacked over one another without an intervening core.

In a further embodiment, the above method is performed wherein providing the second substrate includes providing a first dielectric layer with a conductor covering one surface; forming first level vias in the first dielectric layer; forming first level conductive material in the first level vias; forming first level conductive traces over the conductive material in the first level vias; and disposing a second dielectric layer over the conductive traces. In another embodiment, the method continues by forming second level vias in the second dielectric layer; forming conductive material in the second level vias in the second dielectric layer; forming second level conductive traces over the conductive material in the second level vias; and patterning the conductor covering the one surface for receiving external connectors.

In yet another embodiment, in the above methods, the methods include flip chip mounting the one or more integrated circuits to the second level conductive traces of the second substrate. In still a further embodiment, the methods include embedding the one or more integrated circuits into the second substrate.

In an embodiment, a semiconductor device structure includes a first integrated circuit package and a second integrated circuit package. The first integrated circuit package includes at least one integrated circuit device mounted on a first substrate, a plurality of package on package connectors extending from a bottom surface of the first substrate, and a cavity formed on the bottom surface and extending into the first substrate. The package on package connectors are arranged spaced from the cavity. The second integrated circuit package includes at least another integrated circuit device mounted on a second substrate, a plurality of lands on an upper surface of the second substrate coupled to the plurality of package on package connectors, and a plurality of external connectors extending from a bottom surface of the second integrated circuit package. At least a portion of the at least another integrated circuit device extends into the cavity on the bottom surface of the first substrate.

In another embodiment, a package on package device structure includes a first package and a second package. The first package includes a first substrate including a substrate core, a first die bonded to the first substrate, a plurality of connectors extending from a bottom surface of the first substrate, and a cavity in a portion of the bottom surface of the first substrate. The second package includes a second substrate including a plurality of dielectric layers and conductors stacked together without an intervening core, a second die bonded to the second substrate, wherein a bottom portion of the second die is embedded in the second substrate, and wherein a top portion of the second die extends into the cavity in the bottom surface of the first substrate, and a plurality of lands on an upper surface of the second substrate. The plurality of lands is coupled to the plurality of connectors, and the plurality of connectors extends between the first substrate and the second substrate.

In yet another embodiment, a semiconductor device structure includes a first integrated circuit package and a second integrated circuit package. The first integrated circuit package includes at least one integrated circuit device bonded to a first substrate including a core, and having a plurality of package on package connectors extending from a bottom surface of the first substrate and arranged in rows at a periphery of the first substrate. The second integrated circuit package includes at least another integrated circuit device mounted on a second substrate using copper connectors formed on bond pads of the at least another integrated circuit device connected directly to copper traces on an upper surface of the second substrate, including a plurality of lands on the upper surface of the second substrate coupled to the plurality of package on package connectors, and including a plurality of external connectors extending from a bottom surface of the second integrated circuit package. The plurality of package on package connectors extends between the first substrate and the second substrate. The first substrate includes a cavity formed in a central portion of the bottom surface of the first substrate.

The scope of the present application is not intended to be limited to the particular illustrative embodiments of the structures, methods, and steps described in the specification. As one of ordinary skill in the art will readily appreciate from the disclosure of the example embodiments, processes, or steps, presently existing or later to be developed, that perform substantially the same function or achieve substantially the same result as the corresponding embodiments described herein may be utilized and these alternatives are contemplated as part of the embodiments. Accordingly, the appended claims are intended to include within their scope such processes or steps.

What is claimed is:

1. A semiconductor device structure, comprising:
   a first integrated circuit package comprising at least one integrated circuit device mounted on a first substrate, the first substrate having a bottom surface and a top surface opposite the bottom surface, the top surface in contact with a molding compound overlying the first substrate, a plurality of package on package connectors extending from the bottom surface of the first substrate, and a cavity formed on the bottom surface and extending into the first substrate, the package on package connectors arranged spaced from the cavity, the first substrate having a first thickness from the bottom surface to the top surface over the package on package connectors and a second thickness from the bottom surface to the top surface over the cavity, the first thickness being greater than the second thickness; and
   a second integrated circuit package comprising at least another integrated circuit device mounted on a second substrate, a plurality of lands on an upper surface of the second substrate coupled to the plurality of package on package connectors, and a plurality of external connectors extending from a bottom surface of the second integrated circuit package;
wherein at least a portion of the at least another integrated circuit device extends into the cavity on the bottom surface of the first substrate.

2. The semiconductor device structure of claim 1, wherein the second substrate comprises a plurality of dielectric layers and conductors stacked together without an intervening core.

3. The semiconductor device structure of claim 1, wherein the first substrate comprises a first plurality of dielectric layers on a first surface of a core material, and a second plurality of dielectric layers on a second surface of the core material, and wherein the cavity is formed in the second plurality of dielectric layers.

4. The semiconductor device structure of claim 3, wherein the second substrate comprises a third plurality of dielectric layers on an upper surface of a second core material, and a fourth plurality of dielectric layers on a lower surface of the second core material.

5. The semiconductor device structure of claim 4, wherein the third plurality of dielectric layers has a greater number of dielectric layers than the fourth plurality of dielectric layers.

6. The semiconductor device structure of claim 3, wherein the core material comprises one of woven glass reinforced epoxy resin, BT resin, and FR4.

7. The semiconductor device structure of claim 1, wherein the plurality of package on package connectors and the plurality of external connectors comprise solder.

8. A package on package device structure, comprising:
a first package comprising:
a first substrate comprising a substrate core and a plurality of dielectric layers;
a first die bonded to the first substrate;
a plurality of connectors extending from a bottom surface of the first substrate; and
a cavity in a portion of the bottom surface of the first substrate and extending through at least one of the plurality of dielectric layers; and
a second package comprising:
a second substrate comprising a plurality of dielectric layers and conductors stacked together without an intervening core;
a second die bonded to the second substrate, wherein a top portion of the second die extends into the cavity in the bottom surface of the first substrate; and
a plurality of lands on an upper surface of the second substrate, wherein the plurality of lands are coupled to the plurality of connectors, the plurality of connectors extending between the first substrate and the second substrate.

9. The package on package device structure of claim 8, further comprising a plurality of external connectors extending from a bottom surface of the second substrate.

10. The package on package device structure of claim 8, wherein the plurality of dielectric layers of the first substrate further comprises a first plurality of dielectric layers on a first surface of the substrate core, and a second plurality of dielectric layers on a second surface of the substrate core.

11. A semiconductor device structure, comprising:
a first integrated circuit package comprising at least one integrated circuit device bonded to a first substrate and having a plurality of package on package connectors extending from a bottom surface of the first substrate and arranged in rows at a periphery of the first substrate, the first substrate comprising:
a core;
a first plurality of dielectric layers on a first surface of the core; and
a cavity formed through a central portion of the first plurality of dielectric layers on the first surface of the core; and
a second integrated circuit package comprising at least another integrated circuit device mounted on a second substrate using copper connectors formed on bond pads of the at least another integrated circuit device connected directly to copper traces on an upper surface of the second substrate, comprising a plurality of lands on the upper surface of the second substrate coupled to the plurality of package on package connectors, and comprising a plurality of external connectors extending from a bottom surface of the second integrated circuit package, the plurality of package on package connectors extending between the first substrate and the second substrate.

12. The semiconductor device structure of claim 11, wherein the at least another integrated circuit device of the second integrated circuit package extends partially into the cavity formed through the central portion of the first plurality of dielectric layers.

13. The semiconductor device structure of claim 11, wherein the plurality of package on package connectors comprise solder.

14. The semiconductor device structure of claim 11, wherein the plurality of external connectors comprise solder.

15. The semiconductor device structure of claim 11, wherein the first substrate further comprises a second plurality of dielectric layers on a second surface of the core, the second surface being opposite the first surface.

16. The semiconductor device structure of claim 11, wherein the at least another integrated circuit device is partially embedded in the second substrate.

17. The semiconductor device structure of claim 11, wherein the at least one integrated circuit device is a memory.

18. The semiconductor device structure of claim 11, wherein the at least another integrated circuit device is a microprocessor.

19. The semiconductor device structure of claim 11, wherein at least the second substrate has a major surface and comprises a plurality of dielectric layers and conductors, including conductors extending parallel to the major surface of the second substrate and conductors extending perpendicular to the major surface of the second substrate, the dielectric layers and the conductors being stacked together without an intervening core.

20. The package on package device structure of claim 8, wherein the substrate core comprises one of woven glass reinforced epoxy resin, BT resin, and FR4.

* * * * *